United States Patent [19]

Woodhead et al.

[11] Patent Number: 5,091,348

[45] Date of Patent: Feb. 25, 1992

[54] SOL-GEL METHOD OF MAKING CERAMICS

[75] Inventors: James L. Woodhead, Banbury; Paul Groves, Charlbury, both of England

[73] Assignee: Alcan International Limited, Montreal, Canada

[21] Appl. No.: 339,306

[22] Filed: Apr. 17, 1989

[30] Foreign Application Priority Data

Apr. 22, 1988 [GB] United Kingdom ............... 8809608

[51] Int. Cl.$^5$ ....................................... C04B 35/46.26
[52] U.S. Cl. ....................................... 501/136; 501/12; 501/126; 501/134; 501/135; 501/139; 423/594; 423/596; 423/598; 252/519; 252/520; 252/62.61; 252/62.9
[58] Field of Search ............... 501/12, 136, 139, 126, 501/134, 135; 423/598, 596, 594; 252/62.61, 62.9, 519, 520

[56] References Cited

U.S. PATENT DOCUMENTS

| | | |
|---|---|---|
| 4,349,456 | 9/1982 | Sowman ............................ 501/12 |
| 4,591,575 | 5/1986 | Okabayashi et al. ............... 501/134 |
| 4,748,016 | 5/1988 | Browaeys ........................... 501/136 |
| 4,757,037 | 6/1988 | Colombet et al. ................. 501/134 |
| 4,789,653 | 12/1988 | Ogata et al. ...................... 423/598 |

FOREIGN PATENT DOCUMENTS 202564 7/1986 Japan ................................ 423/598

OTHER PUBLICATIONS

McCarthy et al., "Gel Route to Homogeneous Glass Preparation: II, Gelling and Desiccation", Jour. ACS, 12, 1971.

*Primary Examiner*—Mark L. Bell
*Assistant Examiner*—C. Melissa Bonner
*Attorney, Agent, or Firm*—Cooper & Dunham

[57] ABSTRACT

The invention concerns sol-gel techniques for making PZT-type ceramics having a perovskite-type structure and ferrite ceramics having a spinel-type structure. Colloidal hydrated oxide sols are mixed with metal salt solutions in the required concentration and the mixed sols dehydrated to form homogeneous gels which are fired at 250° C.–650° C., pressed and sintered at 900°–1300° C. The resulting ceramics include PZT4, PZT5 and lithium ferrites. These have excellent homogeneity, small grain size, high density and improved electrical properties, particularly low dielectric loss, compared with known ceramics of similar composition.

21 Claims, 3 Drawing Sheets

| Pb | Zr | Ti | Sr |
|---|---|---|---|
| 4.3 ml of 307 g l$^{-1}$ Pb(NO$_3$) solution 5.9 moles Pb | 909 ml of 446 g l$^{-1}$ ZrO$_2$ sol 3.28 moles Zr | 794 ml of 298 g l$^{-1}$ TiO$_2$ sol 2.96 moles Ti | 174 ml of 225 g l$^{-1}$ Sr(NO$_3$)$_2$ solution 0.378 moles Sr |

Solutions and sols mixed together and stirred
10 minutes
$\rho = 1.366$ gcc$^{-1}$
pH = 0.6  K = 78 mmho
volume = 6.55 l

| Spray Dry |

| Heat Treat |

| PZT microspheres 5-45 μm diameter |

SOL-GEL METHOD OF MAKING CERAMICS

This invention is concerned with sol-gel processing techniques which are used for making ceramic materials, for example titania-based products having a perovskite structure, and ferrite ceramics having a spinel structure, that have application in the field of electroceramics. Of particular interest are lead zirconate titanate (PZT) ceramic materials. Previous reports on solution preparation of such materials have concentrated almost exclusively on alkoxide precursor routes via either sol-gel or sol-precipitate methods. Such techniques suffer from a number of disadvantages:

Gels produced from alkoxide precursors are generally not re-dispersible.

With mixed alkoxides the different hydrolysis rates of the individual alkoxides can result in serious inhomogeneity.

It is not easily possible to control density or porosity of alkoxide-derived sols.

In "Gel Technology in Ceramics", J. Phys. Chem. Solids Vol No 10 pages 1069-1090, BJJ Zelinski and DR Uhlmann describe mixing various sols and solutions which are afterwards gelled and fired.

U.S. Pat. No. 3,725,298 describes a technique for making lead zirconate titanate, in which a mixed sol is gelled by anion removal.

EPA 184900 describes a sol-gel technique for making synthetic rock material to encapsulate radioactive waste.

EPA 141696 describes a sol-gel technique for making barium and other alkaline earth metal titanates, which involves calcination at 700° C. to 1300° C. under specified conditions.

In one aspect the present invention provides a method of making a ceramic material, selected from a titanate ceramic having a perovskite-type structure and a ferrite ceramic having a spinel-type structure, which method comprises mixing a first hydrated oxide sol with at least one second sol and/or at least one metal salt solution in proportions to form a mixed sol having a composition corresponding to that of the desired ceramic material, dehydrating the mixed sol to form a homogeneous gel, and heating the gel to form the desired ceramic material.

Titanate ceramics having a perovskite-type structure include metal titanates and metal zirconates and particularly lead zirconium titanate (PZT-type) ceramics which may typically have the formula $$M\ Zr_xTi_{1-x}O_3$$

where
M is Pb which may be partly or indeed completely replaced by one or more of Ca, Sr, Ba, La, Mg, Na, K, Rb, Li, Cu, Ag, Au or Cd;
x is 0 to 1, preferably 0.4 to 0.6;
wherein the system may also be doped with small amounts of Na, Mg, Li, K, Sc, V, Cr, Mn, Fe, Co, Y, Nb, In, Hf, Ta, W, Ce, Pr, Nd, Sm, Eu, Gd, Tb, Dy, Ho, Er, Tm, Yb, Lu, Th, U, Ni, Cu, Zn, As, Ga, Ge, Rb, Ru or Sn.

PZT-type ceramics can be made by mixing a hydrated titania sol with a hydrated zirconia sol and a solution of a salt, e.g. nitrate or halide, of Pb which may be partly or indeed completely replaced by one or more of the elements listed above, in proportions to form a mixed sol having a composition corresponding to that of the desired ceramic.

Ferrite ceramics having a spinel-type structure may typically have the formula $$Z_yFe_{3-y}O_4$$

where
Z is Li which may be partly or indeed completely replaced by Mg, Mn, Zn, Cu, Ni, Co, Cr, Ba, Sr or Pb;
Y is 0.4 to 2.0;
wherein the system may also include: Al, Si, Na, K, Sc, Ti, V, Ga, Ge, As, Rb, Y, Zr, Nb, Mo, Tc, Ru, Rh, Pd, AG, Cd, In, Sn, Sb, Te, Cs, La, Hf, Ta, W, Pt, Au, Hg, Tl, Bi or a rare-earth.

Ferrite ceramics can be made by mixing a hydrated ferric oxide sol with a solution of a salt of Li which may be partly or indeed completely replaced by one or more the elements listed above, and optionally also with a hydrated titania sol, in proportions to form a mixed sol having a composition corresponding to that of the desired ceramic.

Mixed sol compositions need to be chosen to take account of the fact that some components, particularly Pb and Li, are liable to be volatilized to some extent during sintering. This problem is readily handled in known manner by including an excess of the volatile component in the mixed sol.

A sol represents a suspension or dispersion of discrete colloidal (sub-micron) particles. The method of this invention involves forming a mixed sol by mixing a first sol with at least one second sol and/or at least one metal salt solution. Techniques for doing this without destabilising the sol or forming a precipitate are well known in the art. The first sol is a hydrated oxide sol, for example of zirconium (IV), indium (III), gallium (III), iron (III), aluminium (III), chromium (III), cerium (IV) silicon (IV), or preferably titanium (IV). The second sol may be an alkoxide sol but is preferably selected from the same group as the first sol, and is most preferably a zirconium (IV) sol or an iron (III) sol.

Preferred sols are transparent or translucent, which implies the absence of particles greater than about 0.1 microns, and may be prepared by peptizing with acid a precipitated oxide, hydroxide or carbonate. Calcined oxide powders tend to aggregate in aqueous media and are preferably not used. These sols may be prepared with widely differing properties with respect to primary particle shape and size, and the degree to which the primary particles are aggregated. By treating sols in known manner, or allowing them to mature, there can be obtained high-density gels and oxides. These low and high density sols can then be mixed to cover a range of chemical compositions and to provide the compositions in a range of predetermined densities and/or pore structures.

Individual sols or mixed sols can be doped with salt solutions to provide mixed compositions known to have preferred properties, e.g. piezoelectric property. The following list contains examples of mixed sols.

1. High-density $ZrO_2$-$TiO_2$ compositions produced by sol-mixing, followed by gelation and heat treatment.
2. Low-density $ZrO_2$-$TiO_2$ compositions produced by sol-mixing, followed by gelation and heat treatment.
3. Mixtures of (1) and (2) covering a sensible range of densities.

4. Fabrication of low-density spheres in the composition range $ZrO_2$-$TiO_2$.

5. Fabrication of high-density spheres in the composition range $ZrO_2$-$TiO_2$.

6. Fabrication of fibres (high density) in the composition range $ZrO_2$-$TiO_2$.

7. Adding $Pb(NO_3)_2$ solution to the $ZrO_2$-$TiO_2$ sol mixture to produce preferred PZT compositions for fabrication as powders, films, fibres and bulk ceramics.

8. Adding $La(NO_3)_3$ solution to (7) to produce preferred PLZT compositions for fabrication as powders, films, fibres and bulk ceramics.

9. Adding $Ba(NO_3)_2$ solution to (8) to produce preferred BPLZT compositions for fabrication as powders, films, fibres and bulk ceramics.

10. Adding lead (II) acetate solution to the $ZrO_2$-$TiO_2$ sol mixtures to produce preferred PZT compositions for fabrication as powders, films, fibres and bulk ceramics.

11. Adding lanthanum acetate to (10) to produce preferred PLZT compositions for fabrication as powders, films, fibres and bulk ceramics.

12. Adding barium acetate to (11) to produce preferred BPLZT compositions for fabrication as powders, films, fibres and bulk ceramics.

13. Adding $Ba(NO_3)_2$ solution to the titania sol to produce preferred $BaO$-$TiO_2$ compositions for fabrication as powders, films (membranes), fibres and bulk ceramics.

14. Adding $Ca(NO_3)_2$ solution to the titania sol to produce preferred $CaO$-$TiO_2$ compositions for fabrication as powders, films (membranes), fibres and bulk ceramics.

15. Adding $Sr(NO_3)_2$ solution to the titania sol to produce preferred $SrO$-$TiO_2$ compositions for fabrication as powders, films (membranes), fibres and bulk ceramics.

16. Adding $Cd(NO_3)_2$ solution to the titania sol to produce preferred $CdO$-$TiO_2$ compositions for fabrication as powders, films (membranes), fibres and bulk ceramics.

17. Mixtures of (13), (14), (15) and (16) aded to (8) or (11) to produce preferred $BaO$-$PbO$-$La_2O_3$-$ZrO_2$-$TiO_2$-$CaO$-$SrO$-$CdO$ compositions for fabrication as powders, films (membranes), fibres and bulk ceramics.

18. Adding barium acetate solution to the titania sol to produce preferred $BaO$-$TiO_2$ compositions for fabrication as powders, films (membranes), fibres and bulk ceramics.

19. Adding calcium acetate solution to the titania sol to produce preferred $CaO$-$TiO_2$ compositions for fabrication as powders, films (membranes), fibres and bulk ceramics.

20. Adding cadmium acetate solution to the titania sol to produce preferred $CdO$-$TiO_2$ compositions for fabrication as powders, films (membranes), fibres and bulk ceramics.

21. Mixtures of (18), (19), (20) and (15) added to (8) or (11) to produce preferred $BaO$-$PbO$-$La_2O_3$-$ZrO_2$-$TiO_2$-$CaO$-$SrO$-$CdO$ compositions for fabrication as powders, films (membranes) fibres and bulk ceramics.

The mixed sol is then dehydrated to form a homogeneous gel. Dehydration can be effected by use of a non-aqueous solvent, or more preferably by evaporation of water, under conditions such that the gel is homogeneous. Techniques which involve gelling by anion removal would not yield homogeneous gels and are not envisaged. The preferred dehydration technique is spray drying. Depending on the viscosity of the sol, this can result in the formation of spherical particles or of fibres of gel. If desired, the viscosity of the sol can be increased by addition of an organic additive such as polyethylene oxide, to an extent that fibres may be formed from it. Gels produced by these techniques are generally rehydratable, i.e. readily form sols on addition of water. By contrast, gels formed in other ways e.g. by removal of anions are generally not re-dispersible.

The resulting gel is heated to remove free and bound water. Before or after heating, the gel may be fabricated in known manner, e.g. by grinding to form a powder or pressing to form a shaped body which is subsequently sintered. Generally, the gel is heated to a temperature to perform a chemical reaction such as dissociation, compound formation or polymorphic transformation of the mixed components, and it is a feature of this invention that such reactions often take place at surprisingly low temperatures, typically in the range 250° C. to 650° C. Decomposition of the metal salts on hydrous gel substrates results in reactions at suprisingly low temperatures and in a suprisingly clean manner. The decomposition of metal salts or of hydrous gels alone usually results in a multi-step decomposition to the relevant oxide phase. The method described here results in a single-step decomposition of the metal salt on the hydrous gel substrate.

We believe that these low-temperature reactions are due to one or more of the hydrous gel compounds, e.g. $TiO_2$ or $ZrO_2$ or $Fe_2O_3$, promoting the decomposition of the metal salt components, e.g. $Ba(NO_3)_2$ or $Pb(NO_3)_2$ or $LiNO_3$. We believe that the combined water in the hydrous gel allows the metal salt to ionise and promotes removal of the anion as a volatile acid.

Our hydrated oxide sols typically have particles almost exclusively below 20 nm, e.g. 1–20 nm, in size. Our hydrated oxide sols typically have a pH below 0.8, e.g. −0.5 to +0.8, although sols with pH's up to about 1.2 are possible. We prefer to heat the homogeneous gels at relatively low temperatures, below 700° C., e.g. 250°–650° C., in order to retain maximum activity. The resulting calcined powder typically has a crystallite size below 50 nm, e.g. 5–20 nm. Pressing and sintering results in a ceramic whose grain size is correspondingly small.

The product which results from heating the gel at temperatures below 700° C. has (depending on composition) a perovskite-type or a spinel-type structure. This product can be comminuted, e.g. by grinding or simply by pressing. Shaped compacts can then be sintered by heating at higher temperatures in the range 700° C. to 1500° C. to develop the required electrical properties. For PZT-type ceramics, preferred sintering conditions are 1050° C. to 1300° C., e.g. 1200° C. for 1 to 12 hours e.g. 2 hours. For ferrite ceramics, preferred sintering conditions are 800° C. to 1200° C. e.g. 900° C. to 1050° C., with the optimum temperature depending on Ti content. These temperatures are lower than are required when preparative routes have included alkoxide sols or powder mixtures. These lower temperatures reduce manufacturing costs, grain growth and volatilisation.

The resulting ceramic materials have excellent homogeneity, with at least 95%, preferably at least 97% and ideally 100%, of the desired perovskite or spinel structures. The grain size is small and uniform, generally less than 50 microns and often around 5–10 microns; this is in contrast to prior lithium ferrite materials which often have grain sizes around 60 microns. This is important since the power handling capacity of the lithium ferrite ceramic is inversely proportional to grain size. The density is generally at least 97% of theoretical, and higher densities are achieved at lower sintering temperatures than in the prior art. Dielectric loss figures for lithium ferrite materials are generally much lower than prior art materials of corresponding formula, which result in much lower insertion losses.

Further aspects of the invention relate to three particular classes of ceramic material made by the method herein described. These are:

a) PZT4 ceramics having the following properties:
density—at least 95%
dielectric constant—1050–1250
loss factor—less than 0.002
coupling coefficient—0.53–0.60.

b) PZT5 ceramics having the following properties:
density—at least 95%
piezoelectric coefficient—50–160
coupling coefficient—0.55–0.65
dielectric constant—800–1600
loss factor—0.001–0.025
figure of merit—50–1000.

c) Lithium ferrite ceramics having the following properties:
density—at least 95%
grain size—0.2–50 microns
spinwave linewidth—2–12 Oerested
dielectric loss—$1 \times 10^{-4} - 3 \times 10^{-4}$ The method of the invention has the following advantages over prior art methods:

a) Gels of varying composition produced from mixed sols in the manner described are generally redispersible in water. By contrast, gels produced from alkoxide precursors are generally not re-dispersible.

b) Techniques herein described produce homogeneous gels, which is of great importance for performing solid state reactions in ceramic processing.

c) By the use of low-and high-density sols, it is easily possible to control both density and porosity. By contrast, alkoxide-derived sols are low-density and thus do not permit density or porosity control over such large ranges and with such ease.

d) The methods herein described result in chemical reactions, particularly decomposition of metal salts in the presence of hydrous gels, at lower temperatures than are observed in other ceramic processing techniques.

e) Sintering temperatures required to develop required electrical properties are lower than with prior ceramic processing techniques.

f) The method is much more reproducible than prior ceramic processing techniques.

Reference is directed to the accompanying drawings, in which.

Figure 1:
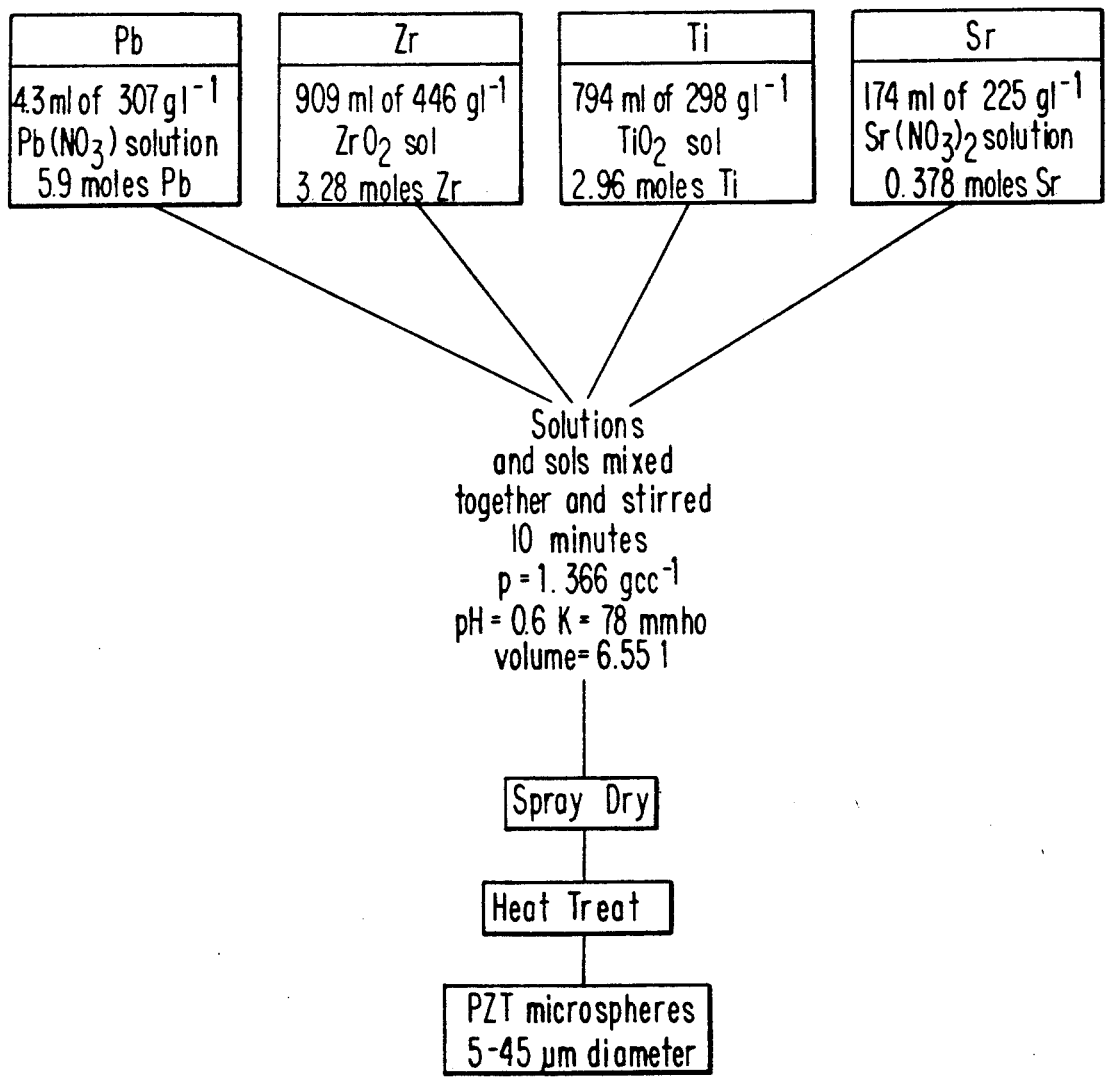
FIG. 1 is a flowsheet for the preparation of a mixed gel for a PZT4 ceramic material.

The following examples illustrate the invention.

EXAMPLE 1

A typical method for preparing a lead zirconate titanate (PZT) material was as follows: Zirconia sol (0.083 l) containing 467 gl$^{-1}$ ZrO$_2$ equivalent was mixed with titania sol (0.035 l) containing 308 gl$^{-1}$ TiO$_2$ equivalent. With stirring, lead nitrate solution (0.395 l), containing 254 gl$^{-1}$ PbO equivalent, was added. No adverse effect, e.g. coagulation, uncontrolled viscosity increase etc., occurred when the mixtures were prepared and aged at 22° C. over several days. The feed had the following properties:

concentration, 274 gl$^{-1}$ mixed oxide; density, 1.35 g/cc; viscosity, 5 cp; pH, 0.46.

After assessment the feed was spray dried at a flow rate of 2.5 l hr$^{-1}$ to yield 110 g of free-flowing gel particles.

The gel was completely redispersible in water. Thermal analysis showed the gel to contain 66% oxide and from the traces it could be seen that the composite material decomposed in a different manner to that found for the individual components. The decomposition temperature was significantly lower and significantly cleaner than that for the respective components.

X-ray analysis showed that the perovskite phase was well formed by 500° C. whereas by conventional powder mixing techniques, a temperature of approximately 900° C. was required to form the perovskite phase.

EXAMPLE 2

A mixture of Zr IV and Ti IV sols, in roughly equal proportion was allowed to dehydrate in air. At a point close to gelation, it was possible to pull meter-long fibres from the sol-mixture. These fibres gelled in air within a few minutes. After calcination in air at 400° C. for 1 hr, X-ray analysis showed the final product to be mainly phase stabilised zirconia (tetragonal phase) together with an as-yet-undetermined phase.

EXAMPLE 3

Titania sol (0.042 l) containing 353 gl$^{-1}$ TiO$_2$ equivalent was slowly added to 0.162 l of 253 gl$^{-1}$ PbO equivalent lead nitrate solution (Pb(NO$_3$)$_2$). The mixture as stirred for 20 minutes. The feed had the following properties: concentration, 274 gl$^{-1}$ mixed oxide; density, 1.312 gcc$^{-1}$; viscosity, 5 cp; pH, 0.3.

The feed was spray dried at a flow rate of 2.5 l hr$^{-1}$. Thermal analysis showed the gel to contain 72% oxide. X-ray analysis showed that the perovskite phase was well formed by 350° C.

EXAMPLE 4

0.124 l of titania sol containing 353 gl$^{-1}$ TiO$_2$ equivalent was added to 2.3 l of 64 gl$^{-1}$ Ba(NO$_3$)$_2$ solution (37.5 gl$^{-1}$ BaO equivalent). No adverse effects were observed during the sol addition. The feed had the following properties: concentration, 53.7 gl$^{-1}$; density, 1.06 gcc$^{-1}$; viscosity, 4 cp; pH, 0.78.

The feed was spray dried at a flow rate of 2.5 l hr$^{-1}$. Thermal analysis showed the gel to contain 59% oxide. X-ray analysis showed perovskite phase to be well formed by 600° C.

EXAMPLE 5

To the PZT feed described in Example 1 was added approximately 4 w/o (on oxide content of PZT feed) polyethylene oxide such that its viscosity increased to 530 cp. Spray drying resulted in a 100% yield of PZT fibres with diameter in the range of 1–5 μm, and length between 10 and 10,000 μm. Calcination of said fibres resulted in the formation of perovskite phase at around 350° C.

EXAMPLE 6

Preparation of PZT4 Ceramic

The composition chosen for this study was that of PZT4A:

$$(Pb_{0.94}Sr_{0.06})(Zr_{0.527}Ti_{0.473})O_3$$

the so-called 'hard' PZT used for gas igniters, ultrasonic drivers and pressure sensing. It is this material and the PZT5 type which dominate the piezoelectric ceramic market.

The above composition is near the morphotrophic phase boundary for the $PbZrO_3$-$PbTiO_3$ system and is known to give optimum permittivities and coupling coefficients.

A flow diagram for the preparation of 3 kg of PZT powder is given in FIG. 1. The properties of the component solutions and sols are summarised in Table 1. The titania sol was prepared from Ti(iv)-chloride using the method of GB 1412937, the zirconia sol from basic zirconium carbonate according to the method of GB 1181794 and the salt solutions from GPR grade strontium and lead nitrates.

The zirconia sol (0.91 l) containing 446 gl$^{-1}$ $ZrO_2$ equivalent was mixed with the titania sol (0.795 l) containing 298 gl$^{-1}$ $TiO_2$ equivalent. With stirring, lead nitrate solution (4.289 l), containing 307 gl$^{-1}$ PbO equivalent, and strontium nitrate solution (0.174 l), containing 225 gl$^{-1}$ SrO equivalent were added. No adverse effects, e.g. coagulation or uncontrolled viscosity increase occurred when the mixture was prepared and aged at 22° C. over several days. The feed had the following properties: concentration, 305 gl$^{-1}$ mixed oxide equivalent; density, 1.366 gcc$^{-1}$; pH, 0.6; viscosity, 5 cp and conductivity, 77.7 mmho.

Following assessment, the feed was spray dried by disc atomization using a flow rate of 2.5 l hr$^{-1}$, and inlet temperature of 230° C. and an outlet temperature of 105° C. to yield ~3 kg of free flowing gel particles. The spherical morphology of the particles imparts excellent flow characteristics to the gel product. The average size of the particles, around 20 μm, can be varied over large ranges by either employing different gelling procedures, i.e. chemical gelation (2-100 μm) or gel precipitation (80-100 μm), or by modifying the feed characteristics for spray drying using either disc atomization (10-40 μm) or nozzle injection (40-80 μm).

The gel, unlike those produced by alkoxide routes, was completely redispersible in water. This is an extremely useful attribute, since if, for whatever reasons, the product is unsuitable for its intended use, it can be re-dispersed in water to form a mixed sol; this sol can then be adjusted accordingly, or if a different morphology is desired, the gelling procedure can be modified.

Figure 2:
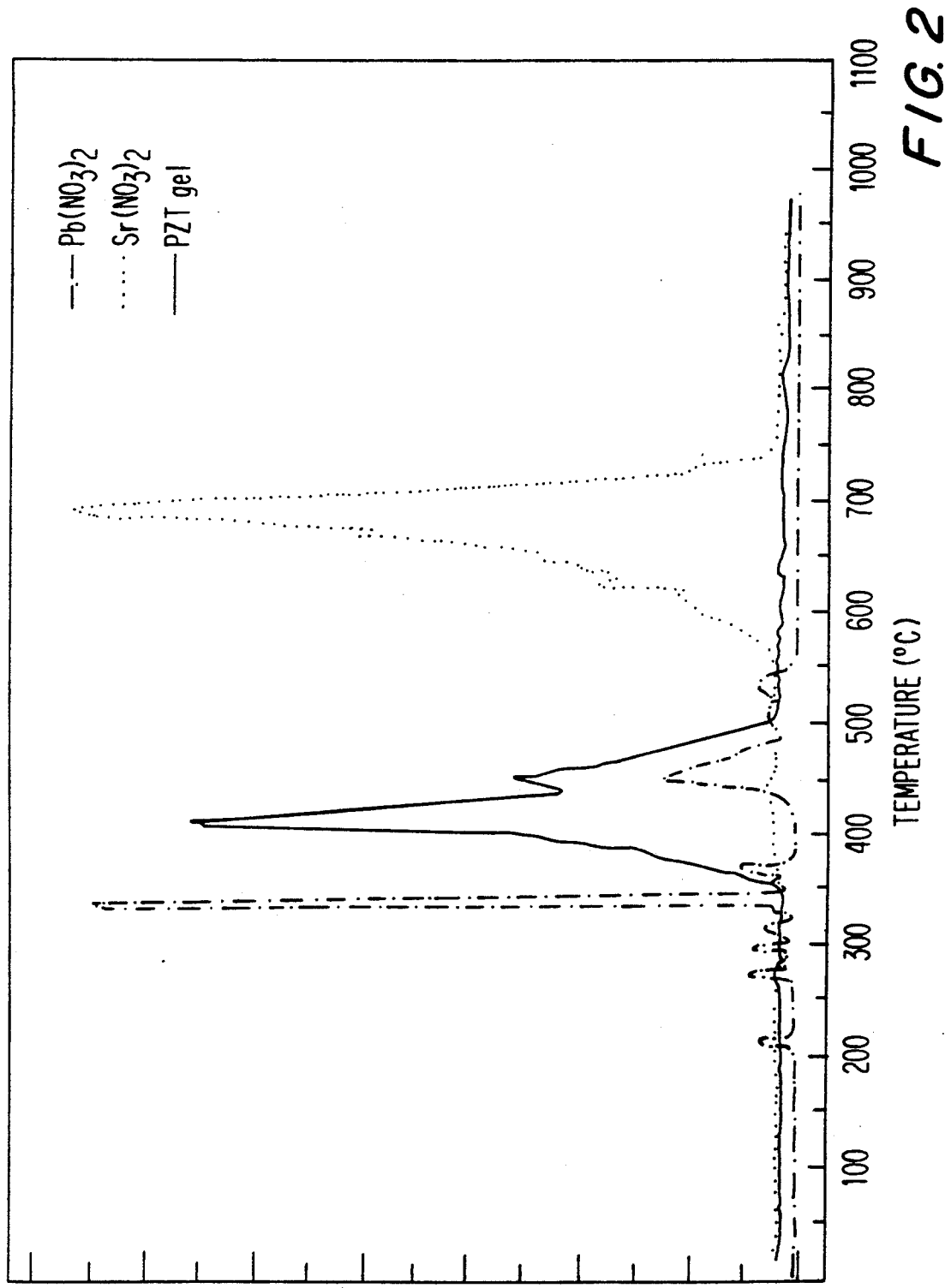
FIG. 2 is three differential thermo-gravimetric traces showing the simpler decomposition of the PZT5 gel on heating.

Thermo-gravimetric analysis showed the gel to contain 66% oxide and from the traces (FIG. 2) it was clear that the composite material chemically decomposed in a manner different to that found for the individual components. The decomposition temperature was significantly lower and the decomposition significantly ceaner than was seen for the respective components. The decomposition of the metal salts or the hydrous gels alone usually results in a multi-step decomposition to the relevant oxide phase. The processing method described here results in an almost single-step decompositon of the metal salt on the hydrous gel substrate. We believe that these low temperature reactions are due to one or more of the hydrous gel compounds promoting the decomposition of the metal salt components.

X-ray analysis of the calcined gel particles showed the perovskite PZT phase to be well formed by 500° C., with no evidence of unreacted constituent oxides. The low temperature reaction and the surprising sharpness of the X-ray diffration peaks at relatively low temperatures is testament of the excellent homogeneity achieved with this system. Conventional powder mixing routes require calcination to at least 800° C. to form the perovskite phase.

Compacts (21 mm diameter×5 mm thickness) were die pressed at 2 tonnes/in$^2$ followed by isostatic pressing to 30000 p.s.i. There was no need to use an organic binder. Green densities were typically 52% theoretical. Standard double-crucible techniques were employed using a buffer PZT powder (UPI 401, Ultrasonic Powders Inc., New Jersey) to maintain a PbO-laden atmosphere during sintering. The sintering behaviour of the as-prepared powder was compared to that of conventionally-prepared mixed-oxide powders.

Densities, typicaly 97-99% theoretical, compare favourably with those produced both by standard powder mixing routes (95-97%) and by alkoxide, coprecipitation routes. It is worth noting that these higher-than-normal densities are achieved some hundred degrees or so lower than normal sintering temperatures employed (1260°-1380° C.).

Other properties also compare favourably with commercial materials. See Table 2.

TABLE 1

Properties of the Components of the PZT Feed

| | pH | density/ gcc$^{-1}$ | concentration/ gl$^{-1}$ | conductivity/ mmho |
|---|---|---|---|---|
| Pb(NO$_3$)$_2$ solution | 2.5 | 1.386 | 307 | 74.4 |
| Sr(NO$_3$)$_2$ solution | 3.0 | 1.348 | 225 | 93.4 |
| TiO$_2$ sol | 0.7 | 1.252 | 298 | 71.6 |
| ZrO$_2$ sol | 0.3 | 1.542 | 446 | 70.0 |

TABLE 2

| PROPERTY | TYPICAL COMMERCIAL | THIS INVENTION |
|---|---|---|
| density | 96% | 98% |
| dielectric constant | 1050 | 1435 |
| loss factor | 0.004 | <0.001 |
| Kp, coupling coefficient | 0.52 | 0.54 |
| | (poled 3 kV/mm) | (poled 2.5 kV/mm) |

EXAMPLE 7

Preparation of PZT5 Ceramics

A. Preparation of Sol and Gel

Zirconia sol (0.670 liters) containing 464 gl$^{-1}$ $ZrO_2$ equivalent was mixed with titania sol (0.875 liters) containing 196 gl$^{-1}$ $TiO_2$ equivalent. Lead nitrate solution (4.240 liters, 210 gl$^{-1}$ PbO plus either 0.0424 l or 0.0848 l to compensate for Pb volatilization losses), strontium nitrate solution (0.420 liters, 97 gl$^{-1}$ SrO) and a solution of niobium pentachloride (12.69 g NbCl$_5$ in 120 ml water) were added to the sols with stirring. This mixture, termed the feed, had the following properties:

concentration 237 gl$^{-1}$ oxide equivalent; density, 128 gcc$^{-1}$; viscosity, 5 cp; pH, 0.07 and total volume, 6.28 liters.

The feed was spray dried and calcined at 600° C. to yield 1.486 kg of free-flowing oxide powder.

B. Preparation of Ceramic Pellets

The oxide powder was ball-milled in acetone for at least 4 hours then dried at room temperature. The powder was uniaxially pressed in 5 g batches in a 15 mm die at 200 psi followed by isostatic pressing at 25000 psi. The green pellets were sintered, using the double crucible technique, at temperatures between 1050° C. and 1300° C., preferably 1200° C. for 2 to 12 hours, preferably 2 hours.

C. Comparison of Properties

TABLE 3

|  | Typical Commercial | This Invention |
|---|---|---|
| Hydrostatic piezoelectric Coefficient, $d_h$ ($pCN^{-1}$) | 35 | 140 |
| Electro-Mechanical Coupling Coefficient, Kp | 0.56 | 0.64 |
| Dielectric Constant (e) | 1725 | 1000 |
| Dielectric Loss Factor (tan d) | 0.02 | 0.02 |
| Hydrophone Figure of Merit ($d^2_h k_p/e$ tan d) | 20 | 627 |

D. Reproducibility of Properties

For 10 ceramics sintered at a given temperature for a given period of time $\geq 90\%$ conformed to IRE standard 61 IRE 14.51 i.e. dielectric properties vary by $\leq 20\%$ and piezoelectric properties vary by $\leq 10\%$.

The commercial rejection rate may be as high as 80%.

EXAMPLE 8

Preparation of Lithium Ferrite

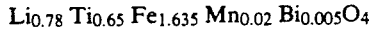
$Li_{0.78} Ti_{0.65} Fe_{1.635} Mn_{0.02} Bi_{0.005} O_4$

Figure 3:
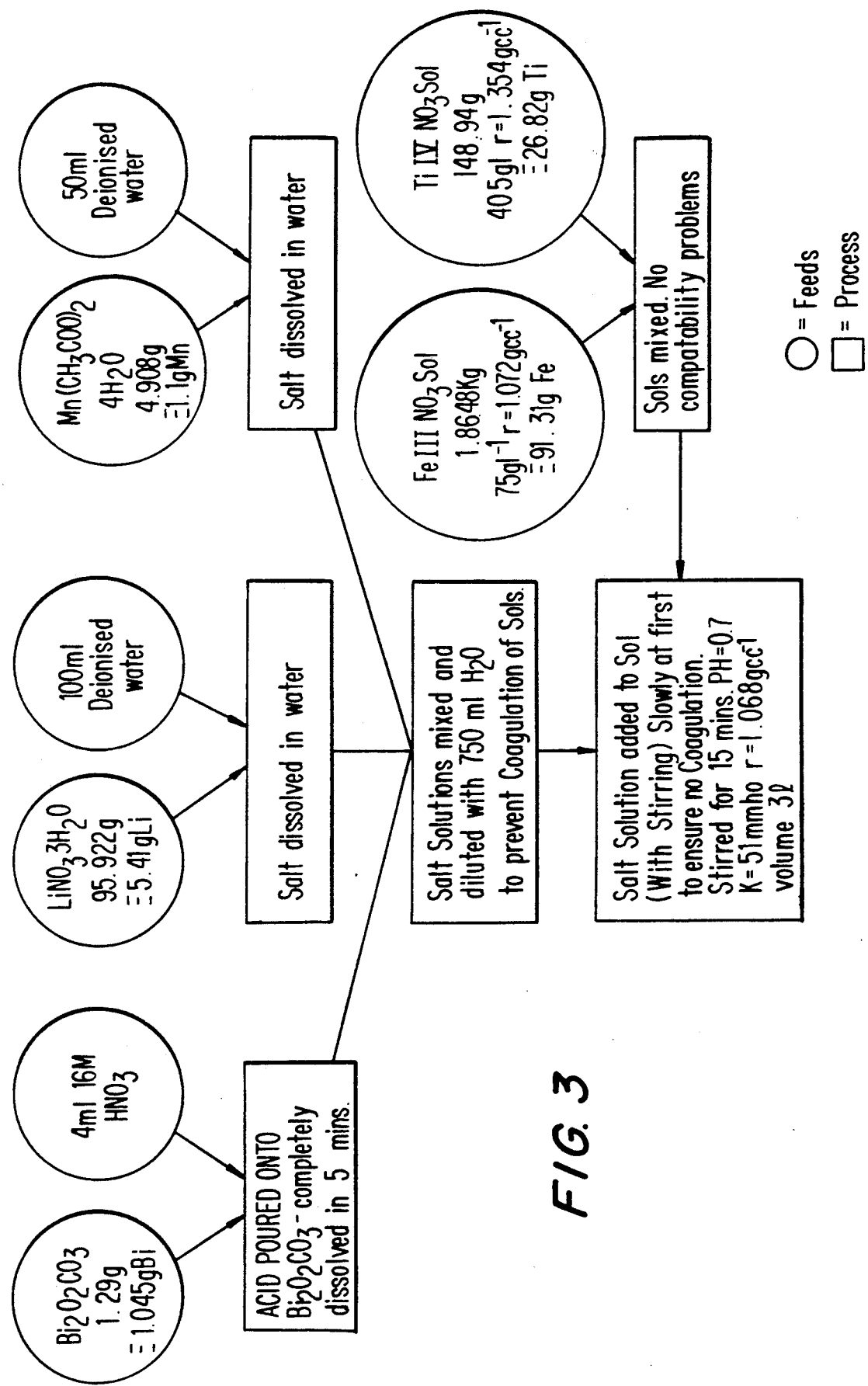
FIG. 3 is a flowsheet for the preparation of a mixed sol for a lithium ferrite ceramic.

Preparation of the mixed sol is illustrated in FIG. 3. The sol was spray dried at an inlet temperature of 180° C. and an outlet temperature of 85° C. to give 209 g of gel. This was heated to 600° C. Transition temperature measurement showed that the ferromagnetic curie point was around 360° C. The resulting powder was ground, then compacted in a die and heated to temperatures in the range 900° C. to 1050° C. to sinter the ceramic. The resulting material had excellent homogeneity and a density of 99% of theoretical.

The following Table 4 lists lithium ferrite compositions prepared by this route.

Table 5 provides a comparison of these compositions against a commercial equivalent.

TABLE 4

| LITHIUM FERRITE COMPOSITIONS | | | | |
|---|---|---|---|---|
|  | $4\pi$ Ms (kGauss) | Tc (°C.) | Grain Size ($\mu$m) | Dielectric Loss |
| LF 1 $Li_{.5}Fe_{2.455}Mn_{.04}Bi_{.005}O_4$ | 3750 | 640 | 5-7 | $1.6 \times 10^{-4}$ |
| LF 2 $Li_{.64}Ti_{.28}Fe_{2.035}Mn_{.04}Bi_{.005}O_4$ | 2200 | 520 | 5-7 | $1.4 \times 10^{-4}$ |
| LF 3 $Li_{.78}Ti_{.56}Fe_{1.615}Mn_{.04}Bi_{.005}O_4$ | 1000 | 300 | 5-7 | $1.5 \times 10^{-4}$ |
| LF 4 $Li_{.5}Fe_{2.46}Mn_{.04}O_4$ |  |  | 5-7 | $1.8 \times 10^{-4}$ |
| LF 5 $Li_{.78}Ti_{.56}Fe_{1.635}Mn_{.02}Bi_{.005}O_4$ |  |  |  |  |
| LF 6 $Li_{.78}Zn_{.1}Ti_{.66}Fe_{1.408}Mn_{.05}Bi_{.002}O_4$ |  |  |  |  |

TABLE 5

| COMPARISON OF LITHIUM FERRITE WITH COMMERCIAL EQUIVALENT | | |
|---|---|---|
| PROPERTY | THIS INVENTION | COMMERCIAL |
| Grain size ($\mu$m) | 5-7 | 100 |
| Spinwave line width (Oe) | 4.5 | 2 |
| Dielectric loss factor | $1.5 \times 10^{-4}$ | $5 \times 10^{-4}$ |
| Resonance line width (Oe) | 650 | 490 |

We claim:

1. A method of making a titanate ceramic material having a perovskite structure comprising mixing a first sol selected from the group consisting of hydrated titanium oxide sol and hydrated zirconium oxide sol with at least one second sol selected from the group consisting of hydrated oxide sols of zirconium (IV), indium (III), gallium (III), iron (III), aluminium (III), chromium (III), cerium (IV), silicon (IV) and titanium (IV), with the proviso that the first and second sols are not the same, wherein the first and second sols are mixed in proportions to form a mixed sol having a composition corresponding to that of the desired ceramic material, and then dehydrating the mixed sol to form a homogeneous gel, and heating the gel to form the desired ceramic material.

2. A method as claimed in claim 1, wherein the first sol is a hydrated titania sol and the second sol is a hydrated zirconia sol.

3. A method as claimed in claim 1, wherein the first sol is mixed with the second sol and with a solution of a salt of at least one metal selected from the group consisting of Pb, Ca, Sr, Ba, La, Rb, Ag, Au, Cd, Na, Mg, Li, K, Sc, V, Cr, Mn, Fe, Co, Y, Nb, In, Hf, Ta, W, Ce, Pr, Nd, Sm, Eu, Gd, Tb, Dy, Ho, Er, Tm, Yb, Lu, Th, U, Ni, Cu, Zn, As, Ga, Ge, Ru and Sn, wherein the first and second sols and the metal salt solution are mixed in proportions to form a mixed sol having a composition corresponding to that of the desired ceramic.

4. A method as claimed in claim 3, wherein a hydrated titania sol is mixed with a hydrated zirconia sol and a solution of a lead salt in proportions to form a mixed sol having a composition corresponding to that of a PZT ceramic.

5. A method as claimed in claim 4, wherein there is included in the mixture at least one further metal salt solution wherein the metal is selected from Ca, Sr, Ba, La, Mg, Na, K, Rb, Li, Cu, Ag, Au and Cd.

6. A method as claimed in claim 1, wherein the mixed sol is dehydrated by spray drying.

7. A method as claimed in claim 1, wherein the gel is heated to form the ceramic material by dissociation, compound formation or polymorphic transformation of the mixed components.

8. A method as claimed in claim 1, wherein the gel is heated at a temperature of from 250° C. to 650° C. to form the ceramic material.

9. A method as claimed in claim 1, wherein the ceramic material is pressed and sintered.

10. A PZT4 ceramic made by the method of claim 1 and having the following properties:
density—at least 95%
dielectric constant—1050-1250
loss factor—less than 0.002
coupling co-efficient—0.53-0.60.

11. A PZT5 ceramic made by the method of claim 1 and having the following properties.

density—at least 95%
piezoelectric coefficient—50-160
coupling coefficient—0.55-0.65
dielectric constant—800-1600
loss factor—0.001-0.025
figure of merit—50-1000.

12. A method of making a ferrite ceramic material having a spinel structure comprising mixing a first sol which is hydrated ferric oxide sol with at least one second sol selected from the group consisting of hydrated oxide sols of zirconium (IV), indium (III), gallium (III), aluminum (III), chromium (III), cerium (IV), silicon (IV) and titanium (IV), and with a solution of a salt of at least one metal selected from the group consisting of Li, Mg, Mn, Zn, Cu, Ni, Co, Cr, Ba, Sr, Pb, Al, Si, Na, K, Sc, Ti, V, Ga, Ge, As, Rb, Y, Zr, Nb, Mo, Tc, Ru, Rh, Pd, Ag, Cd, In, Sn, Sb, Te, Cs, La, Hf, Ta, W, Pt, Au, Hg, Tl, Bi or a rare earth, wherein the first and second sols and the metal salt solution are mixed in proportions to form a mixed sol having a composition corresponding to that of the desired ceramic material, and then dehydrating the mixed sol to form a homogeneous gel, and heating the gel to form the desired ceramic material.

13. A method as claimed in claim 12, wherein the gel is heated to form the ceramic material by dissociation, compound formation or polymorphic transformation of the mixed components.

14. A method as claimed in claim 12, wherein the hydrated ferric oxide sol is mixed with the second sol and with at least one metal salt solution, wherein the metal is selected from the group consisting of Li, Mg, Mn, Zn, Cu, Ni, Co, Cr, Ba, Sr and Pb in proportions to form a mixed sol having a composition corresponding to that of a ferrite ceramic.

15. A method as claimed in claim 14, wherein the second sol is hydrated titania sol.

16. A method as claimed in claim 12, wherein the mixed sol is dehydrated by spray drying.

17. A lithium ferrite ceramic made by the method of claim 12 and having the following properties:
density—at least 95%
grain size—0.2-50 microns
spinwave linewidth—2-12 Oersted
dielectric loss—$1 \times 10^{-4}$-$3 \times 10^{-4}$
said ceramic having a spinel structure and having the formula $$Z_Y Fe_{3-Y} O_4$$

wherein
Z is Li which may be partly or completely replaced by Mg, Mn, Zn, Cu, Ni, Co, Cr, Ba, Sr or Pb;
Y is 0.4 to 2.0;
and wherein the system may also include Al, Si, Na, K, Sc, Ti, V, Ga, Ge, As, Rb, Y, Zr, Nb, Mo, Tc, Ru, Rh, Pd, Ag, Cd, In, Sn, Sb, Te, Cs, La, Hf, Ta, W, Pt, Au, Hg, Tl, Bi, or a rare earth.

18. A method of making a ferrite ceramic material having a spinel structure comprising mixing a first sol which is a hydrated ferric oxide sol with at least one second sol selected from the group consisting of hydrated oxide sols of zirconium (IV), indium (III), gallium (III), aluminum (III), chromium (III), cerium (IV), silicon (IV) and titanium (IV), wherein the first and second sols are mixed in proportions to form a mixed sol having a composition corresponding to that of the desired ceramic material, and then dehydrating the mixed sol to form a homogeneous gel, and heating the gel to form the desired ceramic material.

19. A method as claimed in claim 18, wherein the gel is heated to form the ceramic material by dissociation, compound formation or polymorphic transformation of the mixed components.

20. A method as claimed in claim 18, wherein the second sol is a hydrated titania sol.

21. A method as claimed in claim 18, wherein the mixed sol is dehydrated by spray drying.

* * * * *